US011597998B2

(12) United States Patent
Cord et al.

(10) Patent No.: US 11,597,998 B2
(45) Date of Patent: Mar. 7, 2023

(54) VACUUM LOCK AND METHOD FOR TRANSFERRING A SUBSTRATE CARRIER

(71) Applicant: SINGULUS TECHNOLOGIES AG, Kahl am Main (DE)

(72) Inventors: Bernhard Cord, Alzenau (DE); Michael Reising, Mömbris (DE); Dieter Scherger, Grosswallstadt (DE)

(73) Assignee: SINGULUS TECHNOLOGIES AG, Kahl am Main (DE)

( * ) Notice: Subject to any disclaimer, the term of this patent is extended or adjusted under 35 U.S.C. 154(b) by 298 days.

(21) Appl. No.: 16/767,743

(22) PCT Filed: Nov. 28, 2018

(86) PCT No.: PCT/EP2018/082798
§ 371 (c)(1),
(2) Date: May 28, 2020

(87) PCT Pub. No.: WO2019/105985
PCT Pub. Date: Jun. 6, 2019

(65) Prior Publication Data
US 2021/0002757 A1    Jan. 7, 2021

(30) Foreign Application Priority Data
Nov. 29, 2017 (DE) ...................... 10 2017 011 064.6

(51) Int. Cl.
 *C23C 14/56* (2006.01)
 *C23C 14/26* (2006.01)
 *C23C 14/50* (2006.01)

(52) U.S. Cl.
CPC .............. *C23C 14/56* (2013.01); *C23C 14/26* (2013.01); *C23C 14/50* (2013.01)

(58) Field of Classification Search
None
See application file for complete search history.

(56) References Cited

U.S. PATENT DOCUMENTS 7,490,714 B2    2/2009    Krause et al.

FOREIGN PATENT DOCUMENTS

CN    101094931 A    12/2007
CN    106232863 A    12/2016
(Continued)

OTHER PUBLICATIONS

Machine Translation of DE 102015117753 A1 (Year: 2017).*
(Continued)

*Primary Examiner* — Shamim Ahmed
*Assistant Examiner* — Bradford M Gates
(74) *Attorney, Agent, or Firm* — Ohlandt, Greeley, Ruggiero and Perle, LLP

(57) ABSTRACT

A vacuum lock for a vacuum coating plant comprises a chamber for receiving a substrate carrier, wherein the chamber comprises a first and a second inner surface. A conveyor is configured for conveying the substrate carrier. The vacuum lock comprises a flow channel assembly for evacuating and venting the chamber, the flow channel assembly being configured to cause a gas flow between both the first inner surface and a first substrate carrier surface facing the first inner surface and between the second inner surface and a second substrate carrier surface facing the second inner surface. The substrate carrier can be positioned between the first and the second inner surfaces such that a ratio of a first distance between the first inner surface and the first substrate carrier surface to a length (L) of the substrate carrier is smaller than 0.1, and a ratio of a second distance between the second inner surface and the second substrate carrier surface to a length (L) of the substrate carrier is smaller than 0.1.

18 Claims, 4 Drawing Sheets

(56) References Cited

FOREIGN PATENT DOCUMENTS

| DE | 10 2005 024 181 A1 | 11/2006 |
|---|---|---|
| DE | 10 2011 011 279 A1 | 8/2012 |
| DE | 10 2012 109 830 A1 | 4/2014 |
| DE | 10 2015 117 753 A1 | 4/2017 |
| WO | 2016/173125 A1 | 11/2016 |

OTHER PUBLICATIONS

International Search Report dated Feb. 19, 2019 from corresponding International Patent Application No. PCT/EP2018/082798, 7 pages.
Written Opinion dated Feb. 19, 2019 from corresponding International Patent Application No. PCT/EP2018/082798, 9 pages.
German Office Action dated Jul. 30, 2018 from corresponding German Patent Application No. 10 2017 011 064.6, 6 pages.
Chinese First Office Action dated Dec. 6, 2021 from corresponding Chinese Patent Application No. 201880077671.4, 27 pages.

\* cited by examiner

VACUUM LOCK AND METHOD FOR TRANSFERRING A SUBSTRATE CARRIER

BACKGROUND

1. Field of the Disclosure

The disclosure relates to apparatuses and methods for introducing substrates into and/or removing substrates from a process line. The disclosure particularly relates to a vacuum lock for a vacuum coating plant and a method for introducing a substrate carrier from an environment under normal pressure into a vacuum coating plant and/or for removing the substrate carrier from the vacuum coating plant into an environment under normal pressure.

2. Discussion of the Background Art

For vacuum coating, the substrates to be coated must be introduced into a process line by means of a vacuum lock whose gas pressure is typically changed between normal pressure and a considerably lower pressure, e.g., a pressure of less than 100 Pa. For a high plant throughput, a short cycle time and thus quick evacuation and venting of the vacuum lock are desirable.

Particularly when it comes to small and lightweight substrates, there is a risk for the substrates to be lifted off their storage area or their position on a substrate carrier or even to get damaged during evacuation or venting. The risk of an undesired movement or damage of the substrates may be reduced by keeping low the time-related pressure change of the vacuum lock during evacuation and venting. However, this increases the time required for the introduction and removal of substrates in an undesired manner. The use of a plurality of vacuum locks by means of which, e.g., substrates are introduced in an alternating manner as is described in, e.g., WO 2016/173125 A1 may effectively increase the cycle time but requires the provision of additional vacuum locks and/or more complex vacuum lock assemblies.

DE 10 2012 109 830 A1 discloses a lock chamber for a horizontal continuous line.

DE 10 2011 011 279 A1 discloses an apparatus for guiding a gas flow during ventilation within a vacuum housing.

DE 10 2005 024 181 A1 discloses a conveying machinery for a vacuum chamber.

In order to prevent substrates from being pressed out of the respective fixtures in the substrate carrier, holding devices may be provided. This leads to an increased effort when it comes to loading and unloading of the substrate carrier. Moreover, the risk of a damage of the substrates continues to be present.

There is a need for improved apparatuses and methods for introducing substrates into and/or removing substrates from a process line. Particularly, there is a need for such apparatuses and methods which are suitable for overcoming differences in pressure in a process or a plant for, e.g., vacuum coating. Particularly, there is a need for such apparatuses and methods that reduce the risk of a substrate being moved in an undesired manner or damaged at or within the substrate carrier during transfer, wherein short cycle times are achievable. In particular, there is a need for such apparatuses and methods that reduce the risk of a substrate being moved in an undesired manner or damaged at or within the substrate carrier during transfer without requiring the provision of a plurality of parallel-operating vacuum locks for introduction into the same process line and/or the use of holding elements which hold the substrates on the substrate carrier.

SUMMARY

According to an aspect of the disclosure, a vacuum lock for a vacuum coating plant is provided, comprising: a chamber for receiving a substrate carrier and having an upper chamber part and a lower chamber part, wherein the chamber comprises a first and a second inner surface; a conveyor with drive components for conveying the substrate carrier; and a flow channel assembly for evacuating and venting the chamber, said flow channel assembly being configured to cause a gas flow in both a first region that extends between the first inner surface and a first substrate carrier surface facing the first inner surface and in a second region that extends between the second inner surface and a second substrate carrier surface facing the second inner surface. A ratio of a first distance $d_1$ between the first inner surface and the first substrate carrier surface to a length of the substrate carrier is smaller than 0.1, preferably smaller than 0.05, further preferably smaller than 0.025. A ratio of a second distance $d_2$ between the second inner surface and the second substrate carrier surface to the length of the substrate carrier is smaller than 0.1, preferably smaller than 0.05, further preferably smaller than 0.025.

When the chamber is being evacuated and/or vented from two sides, the ratio of the first distance $d_1$ to half of the length L of the substrate carrier is preferably smaller than 0.1, preferably smaller than 0.05, i.e., $d_1/(L/2)<0.1$, preferably $d_1/(L/2)<0.05$, and the ratio of the second distance $d_2$ to half of the length L of the substrate carrier is preferably smaller than 0.1, preferably smaller than 0.05, i.e., $d_2/(L/2)<0.1$, preferably $d_2/(L/2)<0.05$.

The vacuum lock may be configured such that a ratio of a first flow resistance between the substrate carrier and the first inner surface to a second flow resistance between the substrate carrier and the second inner surface is between 0.95 and 1.05.

The vacuum lock may be configured such that a ratio of the first flow resistance to the second flow resistance is between 0.97 and 1.03.

The vacuum lock may be configured such that a difference in pressure between the first substrate carrier surface and the second substrate carrier surface is 10 Pa or less, preferably 5 Pa or less, further preferably 4 Pa or less, even if a pressure change rate of at least 100 hPa/s, preferably of at least 300 hPa/s, particularly of 300 hPa/s to 500 hPa/s is reached in the chamber when the chamber is being evacuated or vented.

According to a further aspect of the disclosure, a vacuum lock for a vacuum coating plant is provided, comprising: a chamber for receiving a substrate carrier and having an upper chamber part and a lower chamber part, wherein the chamber comprises a first and a second inner surface; a conveyor with drive components for conveying the substrate carrier; and a flow channel assembly for evacuating and venting the chamber, said flow channel assembly being configured to cause a gas flow in both a first region that extends between the first inner surface and a first substrate carrier surface facing the first inner surface and in a second region that extends between the second inner surface and a second substrate carrier surface facing the second inner surface. The vacuum lock is configured such that a difference in pressure between the first substrate carrier surface and the second substrate carrier surface is 10 Pa or less, preferably 5 Pa or less, further preferably 4 Pa or less, even if a pressure change rate of at least 100 hPa/s, preferably of at least 300 hPa/s, particularly of 300 hPa/s to 500 hPa/s is reached during an evacuation or venting process of the chamber.

The vacuum locks according to the disclosure reduce the risk of substrates being inadvertently lifted off the substrate carrier or damaged when the chamber of the vacuum lock is being evacuated or vented. This applies at a chamber volume of at least 100 l, preferably of 200 to 500 l even with relatively high pressure change rates within the chamber exceeding, e.g., 100 hPa/s or even 300 hPa/s, being between 300 hPa/s and 500 hPa/s, and/or even with venting times of below 10 s.

The substrate carrier may be configured such that the substrates rest within the openings on a substrate carrier in a substantially form-fit manner so that a passage of gas through the substrate carrier with substrates positioned thereon is strongly restricted.

The conveyor may be configured to position the substrate carrier between the first inner surface and the second inner surface of the chamber such that $|d_1-d_2|/\max(d_1, d_2)$ is less than 15%, preferably less than 8%. Here, $d_1$ designates the first distance between the first substrate carrier surface and the first inner surface. The distance $d_2$ designates the second distance between the second substrate carrier surface and the second inner surface.

The flow channel assembly may comprise at least one channel and may be configured to create a gas flow perpendicular to a longitudinal direction of the channel on at least one region of the first substrate carrier surface and at least one region of the second substrate carrier surface and to eliminate crossflows parallel to the longitudinal direction of the channel when the chamber is being vented and/or evacuated.

The longitudinal direction of the channel may run parallel to a longitudinal side of the substrate carrier, wherein the channel is arranged along a longitudinal side of the chamber. The longitudinal direction of the channel may extend perpendicularly to the longitudinal side of the substrate carrier, wherein the channel is arranged along a face side of the chamber.

The flow channel assembly may comprise at least one additional channel which extends parallel to the at least one channel.

The at least one additional channel may be spaced apart from the at least one channel by at least the length of the substrate carrier along a travel direction of the conveyor.

The at least one channel and the at least one additional channel may be arranged at opposing sides of the chamber.

The at least one channel and the at least one additional channel may be arranged symmetrically to each other, particularly mirror-symmetrically with respect to a center plane of the chamber.

Between the evacuating device and opposing sides of the chamber, the vacuum lock may comprise lines for fluid communication that are configured symmetrically to each other. The lines for fluid communication may connect the opposing sides of the vacuum lock with a common evacuating device. For this purpose, the opposing sides may be longitudinal sides or face sides of the chamber.

Alternatively or additionally, the vacuum lock may comprise symmetrically configured lines for fluid communication between the venting device and opposing sides of the chamber. The lines for fluid communication may connect the opposing sides of the chamber with a venting device. For this purpose, the opposing sides may be longitudinal sides or face sides of the chamber.

The vacuum lock may be configured such that the chamber is evacuated via the at least one channel and the at least one additional channel and/or that the chamber is vented via the at least one channel and the at least one additional channel. In this way, consistent flow fields may be created and the risk of undesirably high differences in pressure occurring between the first and second substrate carrier surfaces, which may cause the substrates to be lifted off or get damaged during evacuation and/or venting of the chamber, may be reduced. By means of a simultaneous evacuation of the chamber, e.g., on the two opposing sides of the substrate carrier, the flow between the substrate carrier surfaces and the inner chamber surfaces facing them distributes to the two evacuating channels arranged at the edge of the substrate carrier. In this way, at least for a part of the substrates the maximum gas volume passing across the substrates can be divided in half. This applies analogously for the step of venting the chamber.

The at least one channel may be further divided into a first channel and a second channel which are in fluid communication with each other by means of at least one overflow aperture. The first channel and the second channel may be arranged such that the first channel is arranged geometrically above the second channel.

The vacuum lock may comprise a device for homogenization of the flow between the first channel and the second channel. The device for homogenization of the flow may comprise the at least one overflow aperture. A surface of the overflow aperture may be smaller than a cross section of the second flow channel.

During venting and/or evacuation of the chamber, the at least one channel may be configured to generate the gas flow such that on the first substrate carrier surface and the second substrate carrier surface a pressure gradient is minimized in a direction parallel to the longitudinal direction of the at least one channel. In this way, consistent flow fields may be created and the risk of undesirably high differences in pressure occurring during evacuation and/or venting, which may cause the substrates to be lifted off or get damaged, may be reduced.

The conveyor may be configured to move the substrate carrier along a travel direction. The at least one channel may extend perpendicularly to the travel direction. The at least one channel may extend parallel to the travel direction.

The conveyor may be configured to position the substrate carrier such that it is non-overlapping with the at least one channel during evacuation or venting of the chamber.

The at least one channel may comprise a port for fluid communication of the at least one channel with a venting device and/or an evacuating device.

At the overflow aperture between the first channel and the second channel or at the port for fluid communication of the at least one channel with the venting device and/or the evacuating device, a gas baffle plate may be arranged for deviating the gas flow against a wall of the chamber.

The vacuum lock may comprise at least one connecting piece for connection with an evacuating device and/or a venting device.

The vacuum lock may comprise at least one valve assembly which is provided between the chamber and the evacuating device and/or the venting device.

The valve assembly may comprise a first valve and a second valve which are dimensioned differently from each other.

The vacuum lock may comprise a control for controlling the first valve and the second valve for performing a two-stage venting and/or a two-stage evacuation of the chamber. The control may be configured to control the first valve and the second valve in a time-dependent manner such that a modulus of the pressure change rate in the interior of the chamber is adjustable during venting and/or evacuation.

A vacuum coating plant for coating a plurality of substrates according to an exemplary embodiment comprises the vacuum lock according to an aspect or exemplary embodiment.

The vacuum coating plant may be a plant for physical vapor deposition (PVD), chemical vapor deposition (CVD), or a plant for metalorganic chemical vapor deposition (MOCVD) without being limited thereto.

A further aspect of the disclosure provides a method for introducing a substrate carrier into a vacuum coating plant or for removing the substrate carrier from the vacuum coating plant. The method comprises the following steps: positioning the substrate carrier with a plurality of substrates within a chamber of a vacuum lock, and generating a gas flow on a first substrate carrier surface and a second substrate carrier surface opposite thereto. The substrate carrier is positioned within the chamber such that a ratio of a first distance $d_1$ between a first inner surface of the chamber and the first substrate carrier surface to a length of the substrate carrier is smaller than 0.1, preferably smaller than 0.05, further preferably smaller than 0.025. The substrate carrier is positioned within the chamber such that a ratio of a second distance $d_2$ between a second inner surface of the chamber and the second substrate carrier surface to the length of the substrate carrier is smaller than 0.1, preferably smaller than 0.05, further preferably smaller than 0.025.

When then chamber is being evacuated and/or vented from two sides, the ratio of the first distance $d_1$ to half of the length L of the substrate carrier is preferably smaller than 0.1, preferably smaller than 0.05, i.e., $d_1/(L/2)<0.1$, preferably $d_1/(L/2)<0.05$, and the ratio of the second distance $d_2$ to half of the length L of the substrate carrier is preferably smaller than 0.1, preferably smaller than 0.05, i.e., $d_2/(L/2)<0.1$, preferably $d_2/(L/2)<0.05$.

With this method, a ratio of a first flow resistance between the substrate carrier and the first inner surface to a second flow resistance between the substrate carrier and the second inner surface may lie within a range of 0.95 and 1.05, preferably between 0.97 and 1.03.

A further aspect of the disclosure provides a method for introducing a substrate carrier into a vacuum coating plant or for removing the substrate carrier from the vacuum coating plant. The method comprises the following steps: positioning the substrate carrier with a plurality of substrates within a chamber of a vacuum lock, and generating a gas flow on a first substrate carrier surface and a second substrate carrier surface opposite thereto, wherein a ratio of the magnitude of the flow velocity of the gas flow on the first substrate carrier surface to the magnitude of the flow velocity of the gas flow on the second substrate carrier surface is between 0.95 and 1.05, preferably between 0.97 and 1.03.

A difference in pressure between the first substrate carrier surface and the second substrate carrier surface may amount to 10 Pa or less, preferably 5 Pa or less, further preferably 4 Pa or less, when a pressure change rate of at least 100 hPa/s, preferably of at least 300 hPa/s, particularly of 300 hPa/s to 500 hPa/s is reached during evacuation or venting of the chamber. The chamber volume may be at least 100 l, preferably from 200 to 500 l.

A further aspect of the disclosure provides a method for introducing a substrate carrier into a vacuum coating plant or for removing the substrate carrier from the vacuum coating plant. The method comprises the following steps: positioning the substrate carrier with a plurality of substrates within a chamber of a vacuum lock, and generating a gas flow on a first substrate carrier surface and a second substrate carrier surface opposite thereto such that a difference in pressure between the first substrate carrier surface and the second substrate carrier surface is 10 Pa or less, preferably 5 Pa or less, further preferably 4 Pa or less, when a pressure change rate of at least 100 hPa/s, preferably of at least 300 hPa/s, particularly preferably of 300 hPa/s to 500 hPa/s is reached during an evacuation operation or venting operation of the chamber. The chamber volume may be at least 100 l, preferably from 200 to 500 l.

The vacuum locks and methods according to the disclosure reduce the risk of substrates being inadvertently lifted off the substrate carrier and/or damaged when the chamber of the vacuum lock is being evacuated or vented. This applies at a typical chamber volume of at least 100 l, preferably of 200 to 500 l even with relatively high pressure change rates within the chamber exceeding, e.g., 100 hPa/s or even 300 hPa/s, and/or with venting times of below 10 s.

The substrate carrier may be configured such that the substrates abut the substrate carrier in a substantially form-fit manner so that a passage of gas through the substrate carrier with substrates being positioned thereon is prevented.

The substrate carrier may be positioned between a first inner surface and a second inner surface of the chamber such that a relative difference of a first distance between the first substrate carrier surface and the first inner surface and a second distance between the second substrate carrier surface and the second inner surface is less than 15%, preferably less than 8%. That is, if $d_1$ designates the first distance and $d_2$ designates the second distance, the substrate carrier may be positioned such that $|d_1-d_2|/\max(d_1, d_2)<15\%$ and particularly such that $|d_1-d_2|/\max(d_1, d_2)<8\%$.

The chamber may be evacuated and/or vented via at least one channel having a longitudinal direction such that on the first substrate carrier surface and the second substrate carrier surface crossflows parallel to the longitudinal direction of the at least one channel are eliminated.

The longitudinal direction of the channel may run parallel to a longitudinal direction of the substrate carrier, wherein the channel is arranged along a longitudinal direction of the chamber. The longitudinal direction of the channel may be parallel to a transverse direction of the substrate carrier, wherein the channel is arranged along a face side of the chamber.

The chamber may be evacuated simultaneously via at least two channels arranged at opposing sides of the chamber. By evacuating the chamber simultaneously by means of the at least two channels arranged at the opposing sides of the chamber, a reduction of the maximum gas volume passing across the substrates is achieved.

The chamber may be vented simultaneously via the at least two channels arranged at the opposing sides of the chamber. By venting the chamber simultaneously by means of the at least two channels arranged at the opposing sides of the chamber, a reduction of the gas volume passing across each substrate is achieved.

The transfer method according to the disclosure may be carried out by means of the vacuum lock according to an aspect or exemplary embodiment.

A further aspect of the disclosure provides a method for coating a substrate. The method comprises the following steps: positioning the substrate at a substrate carrier and introducing the substrate carrier into a vacuum coating plant with the method for introducing the substrate carrier according to the disclosure.

The coating method may comprise a physical vapor deposition (PVD), a chemical vapor deposition (CVD), or a metalorganic chemical vapor deposition (MOCVD) without being limited thereto.

The vacuum locks, coating apparatuses and methods according to the disclosure reduce the risk of a substrate being moved in an undesired manner on the substrate carrier or being damaged within the vacuum lock. This is achieved even for relatively short evacuation or venting times at which the pressure change rate within the chamber may exceed, e.g., 300 hPa/s. The vacuum locks, coating apparatuses and methods according to the disclosure are efficient since neither the use of a plurality of parallel-operating vacuum locks for introduction into the same process line nor locking in place of the substrates by means of holding elements are required therewith.

In the following, exemplary embodiments of the disclosure are described in detail with reference to the figures in which identical reference signs designate identical or similar elements.

DETAILED DESCRIPTION OF THE PREFERRED EMBODIMENT

While preferred or advantageous exemplary embodiments will be described with reference to the figures, additional or alternative features may be implemented in further exemplary embodiments. For instance, while a substrate carrier for substantially rectangular substrates is illustrated in the figures, vacuum locks, coating plants and methods according to the disclosure may also be deployed for non-rectangular substrates, e.g., circular substrates. While in the exemplary embodiments illustrated in the figures the chamber is being evacuated and vented via channels provided at opposing face sides, in further exemplary embodiments the channels may also be arranged on the longitudinal sides of the chamber. In further exemplary embodiments, the steps of evacuation and/or venting of the chamber do not necessarily have to take place on two opposing sides of the chamber simultaneously.

Figure 1:
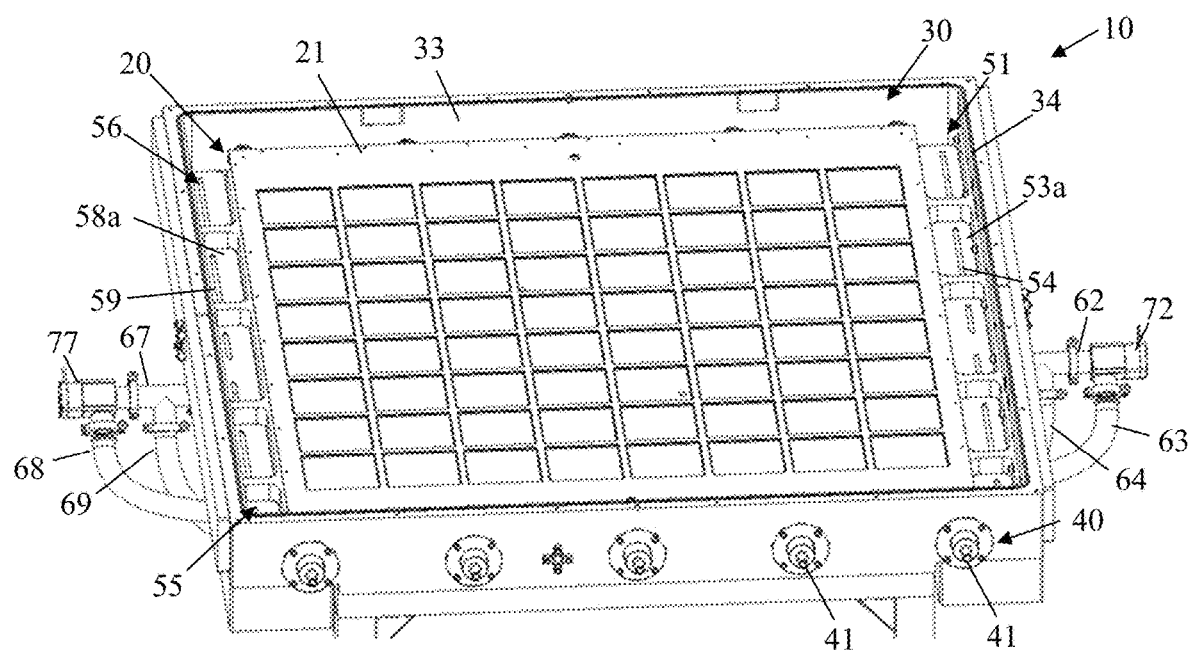
FIG. 1 shows a partial perspective view of a vacuum lock according to an exemplary embodiment.
Figure 2:
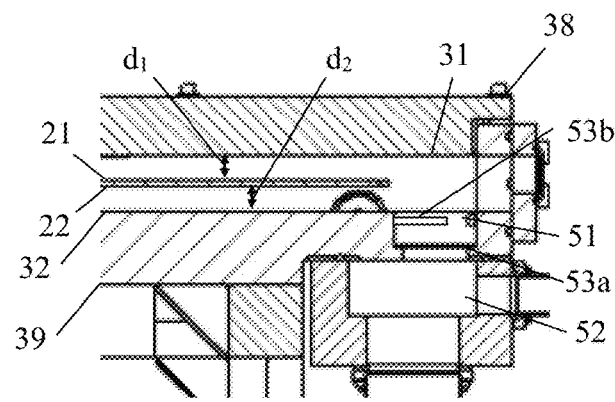
FIG. 2 shows a partial sectional view of the vacuum lock.
Figure 3:
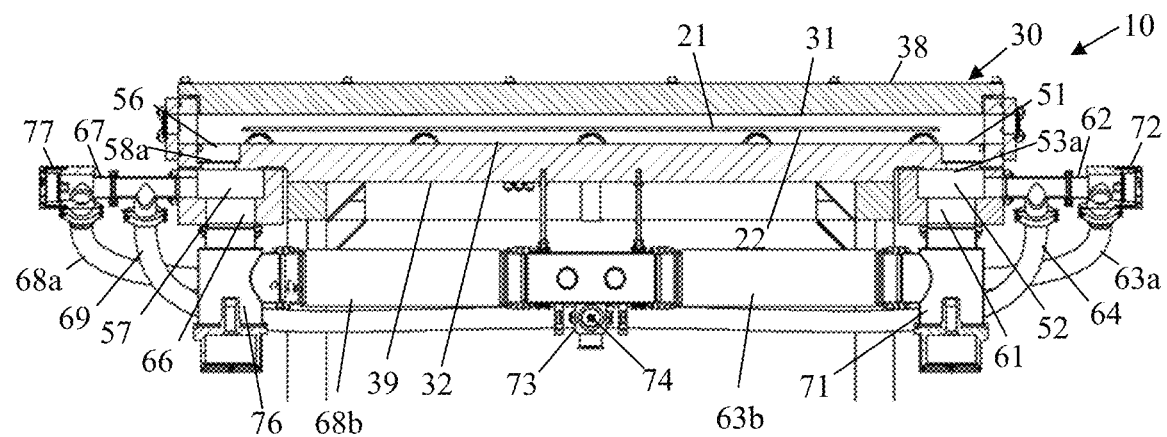
FIG. 3 shows a sectional view of the vacuum lock.
Figure 4:
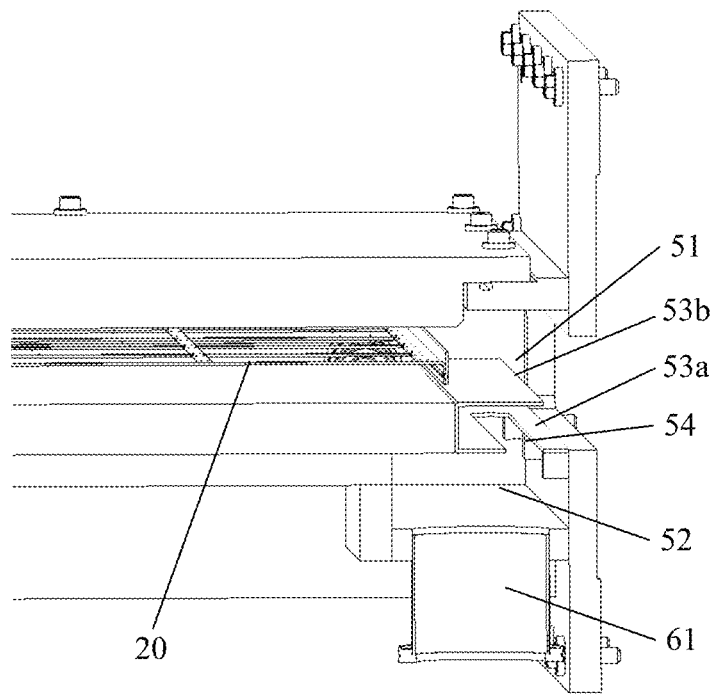
FIG. 4 shows a perspective, partially broken away view of the vacuum lock.

FIG. 1 shows a partial perspective view of a vacuum lock 10 according to the disclosure, wherein an upper chamber part 38 of a chamber 30 of the vacuum lock 10 is not illustrated. FIG. 2 shows a partial sectional view of an end region of a chamber 30 of the vacuum lock 10. FIG. 3 shows a sectional view of the chamber 30. FIG. 4 shows a perspective, partially broken away view of the chamber 30.

The chamber 30 is configured for receiving a substrate carrier 20. The substrate carrier 20 comprises a plurality of receptacles for substrates. For this purpose, each of the substrates may be positioned at the substrate carrier 20 such that pressure compensation through the openings present within the substrate carrier 20 is substantially eliminated when the substrates are positioned at or within the substrate carrier 20.

The chamber 30 comprises an upper chamber part 38 and a lower chamber part 39. The upper chamber part 38 comprises a first inner surface 31 facing toward the substrate carrier 20 during transfer of the substrates. The lower chamber part 39 comprises a second inner surface 32 facing toward the substrate carrier 20 during transfer of the substrates. Preferably, the first inner surface 31 and the second inner surface 32 are substantially even. The substrate carrier 20 comprises a first substrate carrier surface 21 facing toward the first inner surface 31 during transfer of the substrates. The substrate carrier 20 comprises a second substrate carrier surface 22 facing toward the second inner surface 32 during transfer of the substrates.

The chamber 30 comprises an internal volume. The internal volume of the chamber 30 may amount to at least 100 l, preferably from 200 to 500 l.

The vacuum lock 10 comprises a conveyor 40. The conveyor 40 comprises drive components 41 for conveying the substrate carrier. The drive components 41 are configured to move the substrate carrier 20 in a travel direction. The drive components 41 may be a plurality of transport rollers which are arranged spaced apart from each other along the travel direction at the chamber 30. The substrate carrier 20 may abut on the drive components 41.

As shown in FIG. 2 and FIG. 3, the conveyor 40 is configured to position the substrate carrier 20 between the first inner surface 31 and the second inner surface 32 of the chamber 30.

The vacuum lock 10 according to the disclosure is configured such that static differences in pressure between the first substrate carrier surface 21 and the second substrate carrier surface 22 are kept low during venting and/or evacuation, e.g., lower than 10 Pa, preferably lower than 5 Pa, further preferably lower than 4 Pa, while the chamber is being vented or evacuated. For this purpose, different measures can be taken:

The conveyor 40 may position the substrate carrier 20 such that the distances of the substrates within the substrate carrier 20 to the first inner surface 31 and to the second inner surface 32 of the chamber are substantially equal.

A ratio of a distance between an inner surface of the chamber and the opposing substrate carrier surface to a length L of the substrate carrier (illustrated in FIG. 6 and FIG. 7) is smaller than 0.1, preferably smaller than 0.05, further preferably smaller than 0.025. This applies advantageously for both the ratio of a first distance $d_1$ between the first inner surface 31 and the first substrate carrier surface 21 to the length L and for a ratio of a second distance $d_2$ between the second inner surface 32 and the second substrate carrier surface 22 to the length L of the substrate carrier 20.

Figure 6:
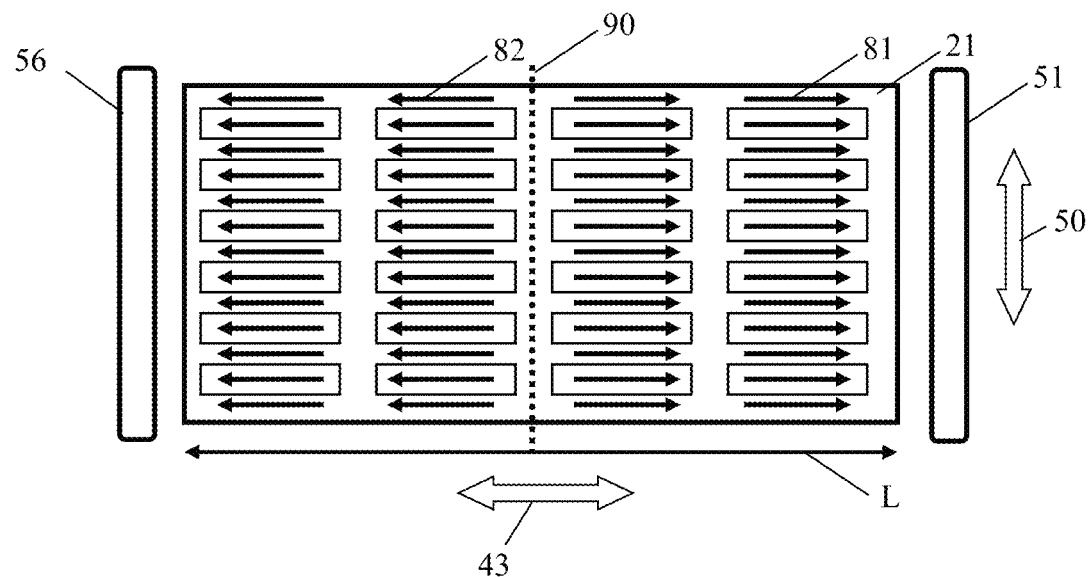
FIG. 6 shows a flow field on a first substrate carrier surface during evacuation of a chamber of the vacuum lock.
Figure 7:
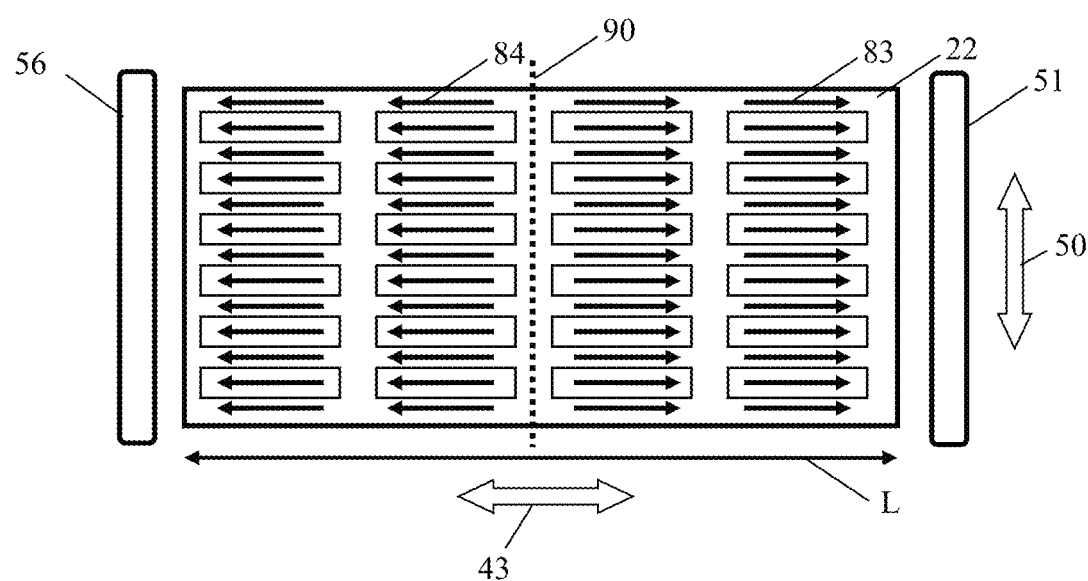
FIG. 7 shows a flow field on a second substrate carrier surface during evacuation of a chamber of the vacuum lock.

In the travel direction of the substrate carrier 20 defined by the conveyor 40, the gas may be introduced and/or removed along the travel direction and opposite the travel direction so that on both halves of the substrate carrier 20 the gas flows in different directions, as is depicted in FIG. 6 and FIG. 7.

The vacuum lock 10 may comprise a flow channel assembly which is configured to enable a gas flow that is substantially homogeneous transversely to the travel direction of the substrate carrier. By means of the flow channel assembly, e.g., diagonal gas flows across the substrate carrier surfaces 21, 22 may be avoided.

By means of the above-mentioned as well as optional additional measures, it can be achieved that, at two points at the first substrate carrier surface 21 and the second substrate carrier surface 22 that are vertically spaced-apart, the velocities of the gas flow are each substantially equal during evacuation of the chamber 30. Moreover, at two points at the first substrate carrier surface 21 and the second substrate carrier surface 22 that are vertically spaced-apart, the velocities of the gas flow may each be substantially equal during venting of the chamber 30. A flow resistance for the gas flow in the region between the first substrate carrier surface 21 and the first inner surface 31 as well as a flow resistance for the gas flow in the region between the second substrate carrier surface 22 and the second inner surface 32 may be substantially equal when the substrate carrier 20 is positioned symmetrically between the first inner surface 31 and the second inner surface 32 in order to minimize static differences in pressure between the first substrate carrier surface 21 and the second substrate carrier surface 22. For instance, a ratio of a first flow resistance between the substrate carrier 20 and the first inner surface 31 to a second flow resistance between the substrate carrier 20 and the second inner surface 32 may lie within a range of 0.95 and 1.05 and preferably between 0.97 and 1.03.

By means of a configuration in which the ratio of the first distance $d_1$ between the first inner surface 31 and the first substrate carrier surface 21 to the length L of the substrate carrier and the ratio of a second distance $d_2$ between the second inner surface 32 and the second substrate carrier surface 22 to a length L of the substrate carrier 20 are each smaller than 0.1, preferably smaller than 0.05 and particularly smaller than 0.025, and in which the distances $d_1$ and $d_2$ are similar to each other, flat interior volumes, which can be quickly vented and/or evacuated, may be formed in the chamber between the substrate carrier and the interior walls of the chamber. Differences in pressure between the upper and lower sides of the substrate carrier may be kept small.

If the chamber is being vented and/or evacuated at two opposing sides, particularly the ratio of the first distance $d_1$ to half of the length of the substrate carrier may be smaller than 0.1, preferably smaller than 0.05, i.e., $d_1/(L/2)<0.1$, preferably $d_1/(L/2)<0.05$, and the ratio of the second distance $d_2$ to half of the length of the substrate carrier may be smaller than 0.1, preferably smaller than 0.05, i.e., $d_2/(L/2)<0.1$, preferably $d_2/(L/2)<0.05$.

The substrate carrier 20 abutting horizontally on the conveyor 40 may have a size of 1 m² or more, particularly of 2 m² or more, e.g., at least 2.25 m². The first substrate carrier surface 21 and the second substrate carrier surface 22 may each be configured so as to be flat. The substrate carrier 20 may be positioned between the first inner surface 31 and the second inner surface 32 of the chamber such that a relative difference of a first distance $d_1$ between the first substrate carrier surface 21 and the first inner surface 31 and of a second distance $d_2$ between the second substrate carrier surface 22 and the second inner surface 32 amounts to less than 15%, preferably less than 8%, i.e., that $|d_1-d_2|/\max(d_1, d_2)<15\%$, and in particular that $|d_1-d_2|/\max(d_1, d_2)<8\%$. By means of a substantially symmetrical positioning of the substrate carrier 20 within the chamber 30, the gas flow generated on the upper and lower sides of the substrate carrier 20 during venting or evacuation, respectively, is equal so that differences in pressure between the first substrate carrier surface 21 and the second substrate carrier surface 22 are avoided.

The vacuum lock 30 comprises a flow channel assembly 51, 52, 56, 57 for evacuating and venting the chamber 30.

The flow channel assembly may comprise a first channel 51 via which the chamber 30 may be both vented and evacuated. The first channel 51 may be arranged at a face side of the chamber 30 at which the substrate carrier 20 is inserted into the chamber 30 or withdrawn from the chamber 30. The first channel 51 may extend transversely to the travel direction of the substrate carrier 20. In another embodiment, the first channel 51 may be arranged on a longitudinal side of the chamber 30 and may extend parallel to the travel direction of the substrate carrier 20.

An additional first channel 56 may be arranged opposite the first channel 51. The additional first channel 56 may enable both venting and evacuation of the chamber 30. During operation, the chamber 30 may be evacuated simultaneously via both the first channel 51 and the additional first channel 56. During operation, the chamber 30 may be vented simultaneously via both the first channel 51 and the additional first channel 56. By means of simultaneous venting or evacuation on opposing sides of the chamber 30, each of the maximum gas volume passing across the substrate carrier 20 is respectively divided in half.

The first channel 51 and the additional first channel 56 are arranged such that the substrate carrier 20 and the substrates positioned thereon do not overlap with the first channel 51 and the additional first channel 56 in a top view during venting and/or evacuation. In this way, differences in pressure between the first substrate carrier surface 21 and the second substrate carrier surface 22 may be avoided. Both the first channel 51 and the additional first channel 56 are preferably dimensioned such that no significant pressure gradient is created in the vertical direction. In this way, it is guaranteed that an identical pumping capacity and venting capacity are achieved on the upper and lower sides of the substrate carrier 20.

In order to reduce static pressure gradients during evacuation and venting of the chamber 30, more complex flow channel assemblies may be used. A second channel 52 may be arranged below the first channel 51. The second channel 52 may communicate with the first channel 51 by means of one or more overflow apertures 54. Each of the overflow apertures 54 may be configured as slot. In a top view, a surface of the one or more overflow apertures 54 may be smaller, particularly much smaller than a surface of the second channel 52 in a horizontal section plane. The overflow apertures 54 between the first channel 51 and the second channel 52 are arranged and dimensioned such that a passage of gas takes place between the first channel 51 and the second channel 52 that is homogeneous along the longitudinal direction of the first channel 51. Thus, the first channel 51 may serve as an upper equalization channel, and the second channel 52 may serve as a lower equalization channel. In combination, the first channel 51 and the second channel 52 may bring about pressure compensation such that along the longitudinal direction of the first channel 51 there is no significant change in the hydrostatic pressure during evacuation or venting, and that along the height of the first channel 51 there is no significant change in the hydrostatic pressure during evacuation or venting.

The flow channel assembly may be configured symmetrically, particularly mirror-symmetrically to a center plane 90 of the chamber 30. An additional second channel 57 may be arranged below the additional first channel 56. The additional second channel 57 may communicate with the additional first channel 56 by means of one or more additional overflow apertures. Each of the additional overflow apertures may be configured as a slot in a slotted plate 58a. An additional baffle plate (not illustrated) for diverting the gas flow may at least partially cover the additional overflow apertures. The additional overflow apertures between the additional first channel 56 and the additional second channel 57 are arranged and dimensioned such that a passage of gas takes place between the additional first channel 56 and the additional second channel 57 that is homogeneous along the longitudinal direction of the additional first channel 56. Thus, the additional first channel 56 may serve as an upper equalization channel, and the additional second channel 57 may serve as a lower equalization channel. In combination, the additional first channel 56 and the additional second channel 57 may bring about pressure compensation such that along the longitudinal direction of the additional first channel 56 there is no significant change in the hydrostatic pressure during evacuation or venting, and that along the height of the additional first channel 56 there is no significant change in the hydrostatic pressure during evacuation or venting.

As illustrated in FIG. 4, additional elements may be provided between the first channel 51 and the second channel 52 for homogenization of the gas flow. The overflow apertures 54 may be provided in a slotted plate 53a. A baffle plate 53b for diverting the gas flow may at least partially cover the overflow apertures 54. The baffle plate 53b may be configured integrally with the slotted plate 53a or may be provided as a separate member different therefrom. The baffle plate 53b may be non-slotted.

Ports for connecting with an evacuating device for evacuating the chamber 30 or with a venting device for venting the chamber 30 may be provided at the second channel 52 and the additional second channel 57. Said ports may be covered with the slotted plate 53a towards the interior of the chamber 30 and/or with the non-slotted baffle plate 53b so that the inflowing gas enters the chamber 30 via the overflow apertures 54 and after being diverted at the baffle plate 53b and is thus slowed down in total. During the venting process, the gas may be slowed down using the overflow aperture 54 and/or the baffle plate 53b. The evacuating device may comprise a pump. The venting device may comprise an inflow aperture for gas.

The chamber 30 and the flow channel assembly with channels 51, 52, 56, 57 are configured such that the gas flows occurring within the chamber 30 are never directed perpendicularly to the substrates positioned on the substrate carrier 20.

The vacuum lock 10 may be configured to evacuate the chamber 30 in two stages. For this purpose, the vacuum lock 10 may comprise a first pump valve 71 and a second pump valve 72. The first pump valve 71 and the second pump valve 72 may have different dimensions and may be controlled by a control unit (not illustrated) such that the first pump valve 71 and the second pump valve 72 are opened sequentially during evacuation in order to generate different pressure change rates within the chamber 30. The first pump valve 71 and the second pump valve 72 may both communicate with the second channel 52. The first pump valve 71 may communicate with a first pump connection 61 adjacent the second channel 52 at the chamber 30. The second pump valve 72 may communicate with a second pump connection 62 adjacent the second channel 52 at the chamber 30.

When the chamber 30 is being evacuated from two opposing sides, a corresponding assembly with an additional first pump valve 76, another first pump connection 66, another second pump valve 77 and another second pump connection 67 may be provided on the opposing side of the chamber 30. During evacuation, the control unit may control the pump valves 71, 72 and the additional pump valves 76, 77 within a first time interval such that the second pump valve 72 and the additional pump valve 77 are open at the same time while the first pump valve 71 and the additional first pump valve 76 are closed. The second valves 72, 77 may have smaller dimensions than the first valves 71, 76 so that a gentler initial pumping may be achieved. During evacuation, the control unit may control the pump valves 71, 72, 76, 77 within a second time interval such that the first pump valve 71 and the additional first pump valve 76 are open at the same time while the second pump valve 72 and the additional second pump valve 77 are also open or closed.

The first pump valve 71 and the additional first pump valve 76 may have an identical configuration. The second pump valve 72 and the additional second pump valve 77 may have an identical configuration. Preferably, only one pumping device by means of which the lock is evacuated from opposing sides of the chamber 30 is used. The connections between the pumping device and the first pump valves 71, 76 and the second pump valves 72, 77 may be symmetrical in order to guarantee an equal pumping performance on both sides of the chamber 30. Here, the sides may be the face sides or longitudinal sides of the chamber 30.

The pump valves may be connected by means of pump lines 63a, 63b, 68a, 68b and a junction with at least one pump. The pump, the first pump valve 71 and the additional first pump valve 76 may be configured to reduce the pressure within the chamber at a rate of at least 100 hPa/s, preferably of at least 300 hPa/s, further preferably of 300 hPa/s to 500 hPa/s within the second time interval during evacuation.

The vacuum lock 10 may be configured to vent the chamber 30 in two stages. For this purpose, the vacuum lock 10 may comprise a first vent valve 73 and a second vent valve 74. The first vent valve 73 and the second vent valve 74 may have different dimensions and may be controlled by the control unit such that the first vent valve 73 and the second vent valve 74 are sequentially opened during venting in order to generate different temporal pressure changes within the chamber 30. The first vent valve 73 and the second vent valve 74 may both communicate with the second channel 52 by means of a vent line 64. The first vent valve 73 and the second vent valve 74 may both communicate with the additional second channel 57 by means of an additional vent line 69. Within a first time interval during venting, the control unit may control the vent valves 73, 74 such that the first vent valve 73 is open while the second vent valve 74 is closed. Within a second time interval during venting, the control unit may control the vent valves 73, 74 such that the second vent valve 74 is open while the first vent valve 73 is closed. In an alternative embodiment, the first vent valve 73 and the second vent valve may both be opened within a second time interval during venting.

Preferably, only one venting device is used in order to vent the chamber 30 from two sides. The connection between the first vent valve 73 and the second channel 52 as well as the connection between the first vent valve 73 and the additional second channel 57 may be symmetrical in order to vent the chamber 30 from both sides of the chamber 30 at the same volume flow rate. The connection between the second vent valve 74 and the second channel 52 as well as the connection between the second vent valve 74 and the additional second channel 57 may be symmetrical in order to vent the chamber 30 from both sides of the chamber 30 at the same volume flow rate. Here, the sides may be the face sides or longitudinal sides of the chamber 30.

Figure 5:
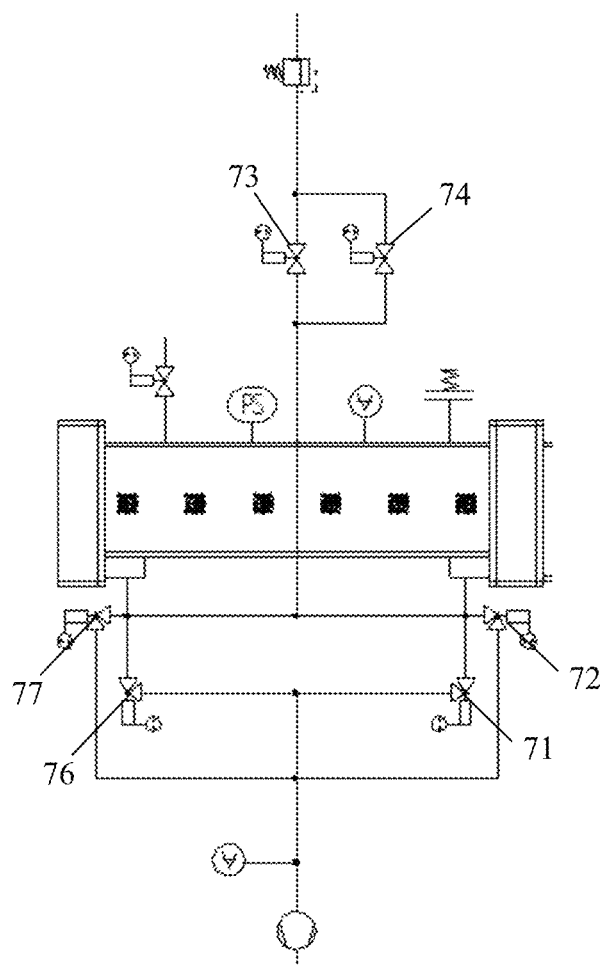
FIG. 5 shows a pneumatic circuit diagram of the vacuum lock.

FIG. 5 shows a pneumatic circuit diagram of the vacuum lock 30. First pump valves 71, 76 and second pump valves 72, 77 with different dimensions as well as first and second vent valves 73, 74 with different dimensions allow a two-stage evacuation and two-stage venting of the chamber to be performed.

For this purpose, gas may symmetrically enter on the opposing sides of the chamber during venting and be symmetrically aspirated on the opposing sides of the chamber during evacuation.

With respect to its fluid-dynamic properties, the system may be configured symmetrically. For this purpose, the connection lines between the first vent valve 73 and the opposing sides of the chamber 30 may be identical in length and dimension and may be arranged symmetrically. The connection lines between the second vent valve 74 and the opposing sides of the chamber 30 may be identical in length and dimension and may be arranged symmetrically.

Alternatively or additionally, the connection lines between the pump and the pump valves 71, 72 may have identical lengths and identical diameters as the connection lines between the pump and the additional pump valves 76, 77. The connection lines between the pump valves 71, 72 and a first side of the lock chamber may have identical lengths and identical diameters as the connection lines between the pump valves 76, 77 and a second side of the chamber 30 opposing the first side.

In this context, the sides of the chamber 30 may be the longitudinal sides or the face sides of the chamber 30, respectively.

FIG. 6 and FIG. 7 illustrate the mode of operation of the vacuum lock 30 according to the disclosure. FIG. 6 shows a velocity field 81, 82 of a gas flow on the first substrate carrier surface 21 during evacuation of the chamber 30. FIG. 7 shows a velocity field 83, 84 of the gas flow on the second substrate carrier surface 22 during evacuation of the chamber 30. Since gas is aspirated on opposing sides via the first channel 51 and the additional first channel 56, a velocity field is generated that is substantially mirror-symmetrical to the center plane 90 of the chamber 30. In this context, for each point on the first substrate carrier surface 21 the velocity 81, 82 of the gas flow has the same magnitude and direction as the velocity 83, 84 of the gas flow at the corresponding, opposing point on the second substrate carrier surface 22. Static differences in pressure are reduced or substantially eliminated.

The configuration of the flow channel assembly leads to a velocity field that is homogeneous along a longitudinal direction 50 of the first channel 51 so that there are no pressure gradients parallel to the longitudinal direction 50 of the first channel 51 on the first substrate carrier surface 21 and the second substrate carrier surface 22. Undesired crossflows, which may result in displacement of the substrates at or within the substrate carrier 20, may thus be avoided.

With the vacuum lock according to the disclosure, the risk of undesired displacement of substrates relative to the substrate carrier 20 as well as the risk of any damage to the substrates are reduced. For instance, a substrate carrier 20 loaded with 64 substrates may be inserted into the lock, which can quickly be evacuated or subsequently vented. The size of the substrate carrier 20 may be 2 $m^2$ or more. Substrates, which may be Si wafers, may have a thickness of 100 μm or more, preferably of between 120 and 500 μm. A thickness of 120 μm corresponds to a weight of approx. 10 g per wafer. At a wafer surface of 15.6×15.6 $cm^2$=243 $cm^2$, the grammage amounts to 10 g/243 $cm^2$=0.041 g/$cm^2$. Consequently, an overpressure of 4.1 Pa on the lower side of the wafer is enough to lift said wafer in the substrate carrier 20 when positioned perpendicularly to the Earth's gravity field. Furthermore, no overpressure must occur on the first substrate carrier surface 21 since otherwise the wafer might be destroyed by the pressure force generated by the difference in pressure between the upper and lower sides. In order to prevent this, it is ensured with the vacuum lock according to the disclosure that the difference in pressure between the first and second substrate carrier surfaces 21, 22 remains smaller than 10 Pa, preferably smaller than 5 Pa, further preferably smaller than 4 Pa. Experiments verify that venting times of 5 s are feasible with vacuum locks having a volume of 350 l. For this purpose, a pressure gradient of 350 hPa/s was reached in the initial phase of venting, which corresponds to a volume flow rate of 120 l/s. When the pressure approaches the external atmospheric pressure, the gradient may flatten to 100 hPa/s. Under the circumstances that a high temporal pressure change rate occurs, no movement of the wafers that had been placed on the substrate carrier 20 occurred in the vacuum lock 10 according to the disclosure.

While exemplary embodiments with respect to the figures have been described, additional and alternative features may be used in further exemplary embodiments. For instance, it is not necessarily required that the chamber is vented simultaneously from two opposing sides and/or that the chamber is evacuated simultaneously from two opposing sides. In further exemplary embodiments, the additional first channel 56 and the additional second channel 57 may also be omitted.

Exemplary embodiments of the disclosure may preferably be used for the coating of wafers. For instance, in a PVD, CVD or MOCVD coating plant, the vacuum lock according to the disclosure may be deployed for rectangular or circular wafers without being limited thereto.

What is claimed is:
1. A vacuum lock for a vacuum coating plant, comprising:
a chamber for receiving a substrate carrier and having an upper chamber part and a lower chamber part, wherein the chamber comprises a first and a second inner surface;
a conveyor with drive components for conveying the substrate carrier;
a flow channel assembly for evacuating and venting the chamber, said flow channel assembly being configured to cause a gas flow in both a first region between the first inner surface;
a first substrate carrier surface facing the first inner surface and in a second region between the second inner surface; and
a second substrate carrier surface facing the second inner surface,
wherein a ratio of a first distance between the first inner surface and the first substrate carrier surface to a length of the substrate carrier is smaller than 0.1, and
wherein a ratio of a second distance between the second inner surface and the second substrate carrier surface to the length of the substrate carrier is smaller than 0.1,
wherein the flow channel assembly comprises at least one channel that is configured to create a gas flow perpendicular to a longitudinal direction of the channel in at least one region of the first substrate carrier surface and at least one region of the second substrate carrier surface and to eliminate crossflows parallel to the longitudinal direction of the channel in the first region and the second region when the chamber is being vented and/or evacuated, wherein the flow channel assembly comprises at least one additional channel which extends parallel to the at least one channel, and the at least one additional channel is spaced apart from the at least one channel by at least the length of the substrate carrier along a travel direction of the conveyor.

2. The vacuum lock according to claim 1, wherein the vacuum lock is configured such that a ratio of a first flow resistance between the substrate carrier and the first inner surface to a second flow resistance between the substrate carrier and the second inner surface is within a range of between 0.95 and 1.05.

3. The vacuum lock according to claim 1, wherein a difference in pressure between the first substrate carrier surface and the second substrate carrier surface is 10 Pa or less when a pressure change rate within the chamber exceeds 100 hPa/s during evacuation or venting of the chamber.

4. The vacuum lock according to claim 1,
wherein the conveyor is configured to position the substrate carrier between the first inner surface and the second inner surface such that $$|d_1-d_2|/\max(d_1,d_2)<15\%,$$

wherein $d_1$ is the first distance between the first substrate carrier surface and the first inner surface and $d_2$ is the second distance between the second substrate carrier surface and the second inner surface.

5. The vacuum lock according to claim 1, wherein at least one of the following applies:
the at least one channel and the at least one additional channel are arranged on opposing sides of the chamber;
the at least one channel and the at least one additional channel are arranged mirror-symmetrically to each other with respect to a center plane of the chamber;
said vacuum lock is configured to evacuate the chamber via the at least one channel and the at least one additional channel; and
said vacuum lock is configured to vent the chamber via the at least one channel and the at least one additional channel.

6. The vacuum lock according to claim 1,
wherein the at least one channel comprises a first channel and a second channel which are in fluid communication by means of at least one overflow aperture.

7. The vacuum lock according to claim 6, comprising a device for homogenization of the flow between the first channel and the second channel, said device comprising the at least one overflow aperture.

8. The vacuum lock according to claim 1, wherein at least one of the following applies:
the at least one channel is configured to generate the gas flow such that on the first substrate carrier surface and the second substrate carrier surface a pressure gradient is minimized in a direction parallel to the longitudinal direction of the at least one channel during venting and/or evacuation of the chamber;
the conveyor is configured to move the substrate carrier along a travel direction, wherein the at least one channel extends perpendicularly or parallel to the travel direction;
the conveyor is configured to position the substrate carrier in a non-overlapping manner with the at least one channel during venting and evacuation of the chamber; and
the at least one channel comprises a port for fluid communication of the at least one channel with a venting device and/or an evacuating device.

9. The vacuum lock according to claim 1, further comprising a gas baffle plate for deviating the gas flow during venting.

10. The vacuum lock according to claim 1, further comprising at least one connecting piece for connection with an evacuating device and/or a venting device.

11. The vacuum lock according to claim 10, further comprising
at least one valve assembly which is provided between the chamber and the evacuating device and/or the venting device;
wherein optionally the valve assembly comprises a first valve and a second valve which are dimensioned differently from each other; and
wherein the vacuum lock optionally further comprises a control for controlling the first valve and the second valve for a two-stage venting or a two-stage evacuation of the chamber.

12. The vacuum lock according to claim 10, further comprising
lines for fluid communication configured symmetrically to each other between the evacuating device and opposing sides of the chamber, and/or lines for fluid communication configured symmetrically to each other between the venting device and opposing sides of the chamber;
wherein optionally the lines for fluid communication connect the opposing sides of the chamber with a common evacuating device or with a common venting device.

13. A vacuum coating plant for coating a plurality of substrates, comprising the vacuum lock according to claim 1.

14. A vacuum lock for a vacuum coating plant, comprising:
a chamber for receiving a substrate carrier and having an upper chamber part and a lower chamber part, wherein the chamber comprises a first and a second inner surface,
a conveyor with drive components for conveying the substrate carrier, and
a flow channel assembly for evacuating and venting the chamber, said flow channel assembly being configured to cause a gas flow in both a first region between the first inner surface and a first substrate carrier surface facing the first inner surface and in a second region between the second inner surface and a second substrate carrier surface facing the second inner surface,
wherein the flow channel assembly comprises at least one channel that is configured to create a gas flow perpendicular to a longitudinal direction of the channel in at least one region of the first substrate carrier surface and at least one region of the second substrate carrier surface and to eliminate crossflows parallel to the longitudinal direction of the channel in the first region and the second region when the chamber is being vented and/or evacuated,
wherein the flow channel assembly comprises at least one additional channel which extends parallel to the at least one channel, and the at least one additional channel is spaced apart from the at least one channel by at least the length of the substrate carrier along a travel direction of the conveyor, and
wherein the vacuum lock is configured such that a difference in pressure between the first substrate carrier surface and the second substrate carrier surface is 10 Pa or less when a pressure change rate within the chamber exceeds 100 hPa/s during an evacuation operation or a venting operation of the chamber.

15. A method for introducing a substrate carrier into a vacuum coating plant or for removing the substrate carrier from the vacuum coating plant, comprising the steps of:
positioning the substrate carrier with a plurality of substrates within a chamber of a vacuum lock,
generating a gas flow on a first substrate carrier surface and a second substrate carrier surface opposite thereto,
wherein the vacuum lock comprises a flow channel assembly that comprises at least one channel that is configured to create a gas flow perpendicular to a longitudinal direction of the channel in a least one region of the first substrate carrier surface and at least one region of the second substrate carrier surface and to eliminate crossflows parallel to the longitudinal direction of the channel in the first region and the second region when the chamber is being vented and/or evacuated,
wherein the flow channel assembly comprises at least one additional channel which extends parallel to the at least one channel, and the at least one additional channel is spaced apart from the at least one channel by at least the length of the substrate carrier along a travel direction of the conveyor
wherein a ratio of a first distance between a first inner surface of the chamber and the first substrate carrier surface to a length of the substrate carrier is smaller than 0.1, and
wherein a ratio of a second distance between a second inner surface of the chamber and the second substrate carrier surface to the length of the substrate carrier is smaller than 0.1.

16. The method according to claim 15, wherein a ratio of a first flow resistance between the substrate carrier and the first inner surface to a second flow resistance between the substrate carrier and the second inner surface is between 0.95 and 1.05; and/or
wherein a difference in pressure between the first substrate carrier surface and the second substrate carrier surface is 10 Pa or less when a pressure change rate exceeds 100 hPa/s during evacuation or venting of the chamber.

17. The method according to claim 15,
wherein the substrate carrier is positioned between a first inner surface and a second inner surface of the chamber such that $|d_1-d_2|/\max(d_1,d_2)<15\%$, wherein $d_1$ is the first distance between the first substrate carrier surface and the first inner surface and $d_2$ is the second distance between the second substrate carrier surface and the second inner surface.

18. The method according to claim 15,
wherein the chamber is evacuated or vented via at least one channel that has a longitudinal direction such that on the first substrate carrier surface and the second substrate carrier surface crossflows parallel to the longitudinal direction of the at least one channel are eliminated;
wherein optionally the chamber is evacuated simultaneously via at least two channels arranged at opposing sides of the chamber, or wherein optionally the chamber is vented simultaneously via at least two channels arranged at opposing sides of the chamber.

* * * * *